United States Patent [19]

Ting et al.

[11] Patent Number: 5,723,994
[45] Date of Patent: Mar. 3, 1998

[54] LEVEL BOOST RESTORATION CIRCUIT

[75] Inventors: Tah-Kang Joseph Ting, Hsinchu; Chun Shiah, Taichung; Bor-Doou Rong, Hsinchu, all of Taiwan

[73] Assignee: Etron Technology, Inc., Hsin-Chu, Taiwan

[21] Appl. No.: 661,288

[22] Filed: Jun. 10, 1996

[51] Int. Cl.[6] .................................................. H03K 7/08
[52] U.S. Cl. ........................................ 327/174; 327/390
[58] Field of Search ................................ 327/14, 22–26, 327/31, 34–38, 165, 166, 170, 172–176, 178, 277, 333, 309, 390, 589

[56] References Cited

U.S. PATENT DOCUMENTS

| | | | |
|---|---|---|---|
| 5,075,571 | 12/1991 | Dhong et al. | 307/296.2 |
| 5,187,385 | 2/1993 | Koike | 327/34 |
| 5,270,588 | 12/1993 | Choi | 307/475 |
| 5,381,051 | 1/1995 | Morton | 327/589 |
| 5,493,538 | 2/1996 | Bergman | 327/26 |
| 5,514,994 | 5/1996 | Sawada | 327/589 |
| 5,594,380 | 1/1997 | Nam | 327/589 |
| 5,646,571 | 7/1997 | Ohashi | 327/390 |

FOREIGN PATENT DOCUMENTS

| | | | |
|---|---|---|---|
| 356032824 | 4/1981 | Japan | 327/34 |

*Primary Examiner*—Timothy P. Callahan
*Assistant Examiner*—My-Trang Nu Ton
*Attorney, Agent, or Firm*—George O. Saile; Stephen B. Ackerman

[57] ABSTRACT

A spurious glitch elongation circuit is described. The spurious glitch elongation circuit will allow the restoration of the output level of a level boost driving circuit. The circuit has a one-sided delay chain to increase the pulse width of spurious glitches that are from one logic state to a second logic state and return to the first logic state, while minimizing spurious glitches that are from the second logic state to the first logic state and returned to the second logic state.

17 Claims, 12 Drawing Sheets

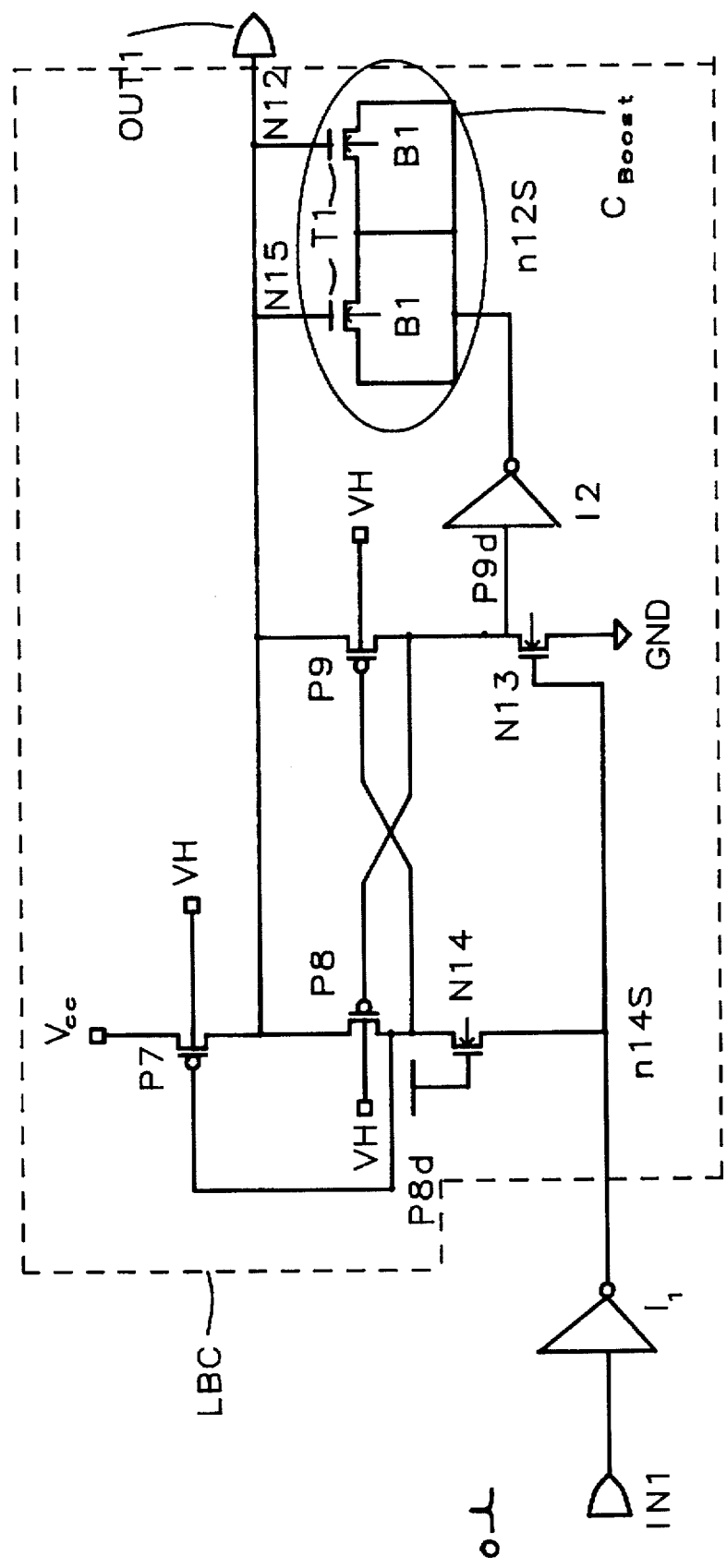
FIG. 1 – Prior Art

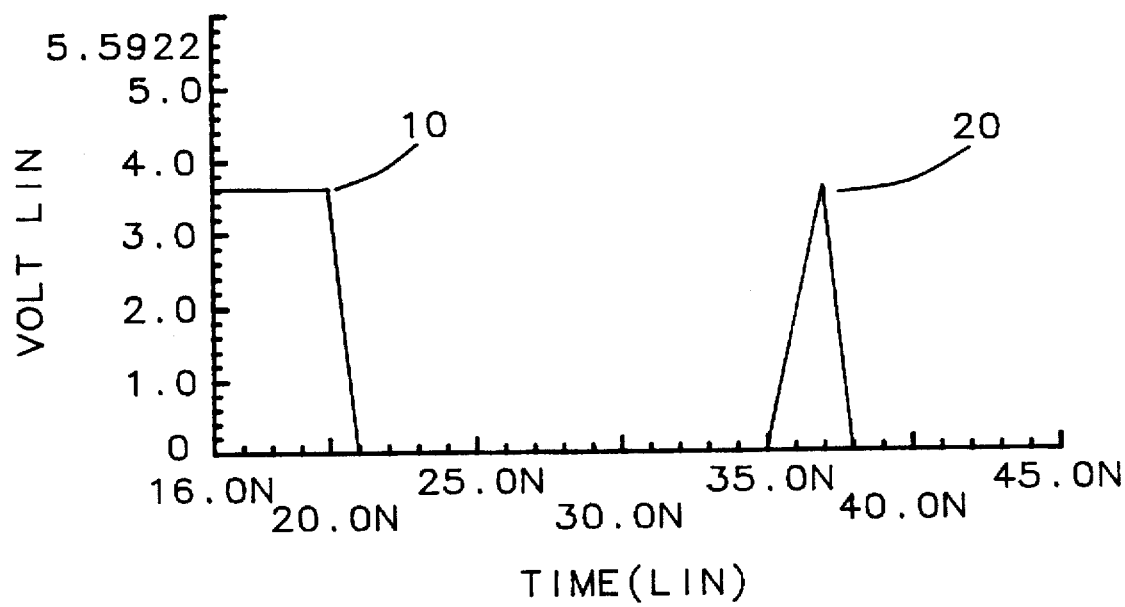
*FIG. 2a - Prior Art*
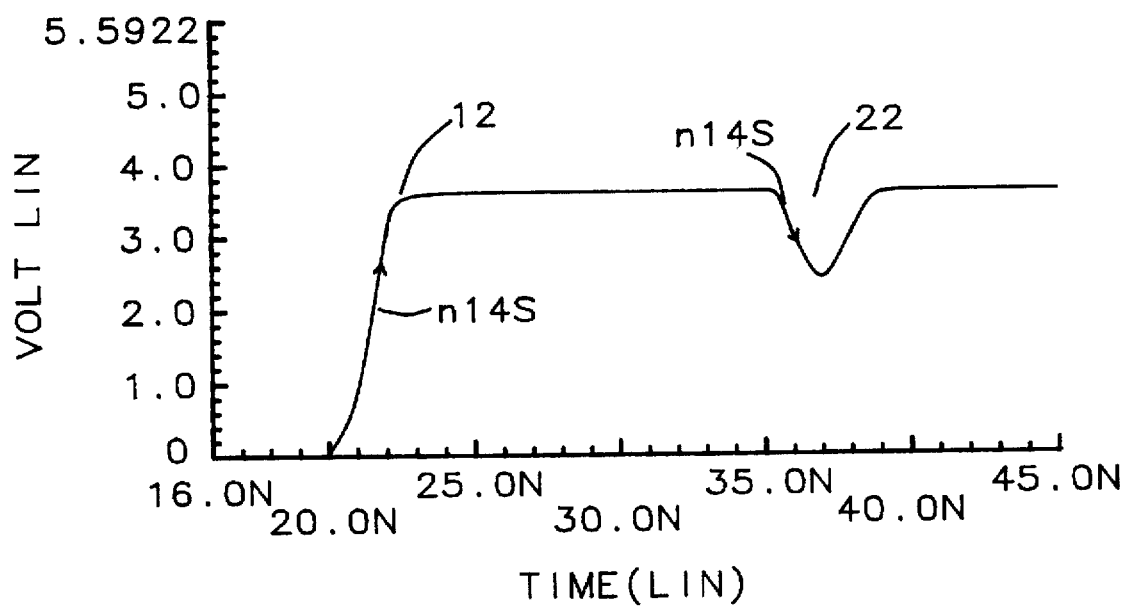
*FIG. 2b - Prior Art*

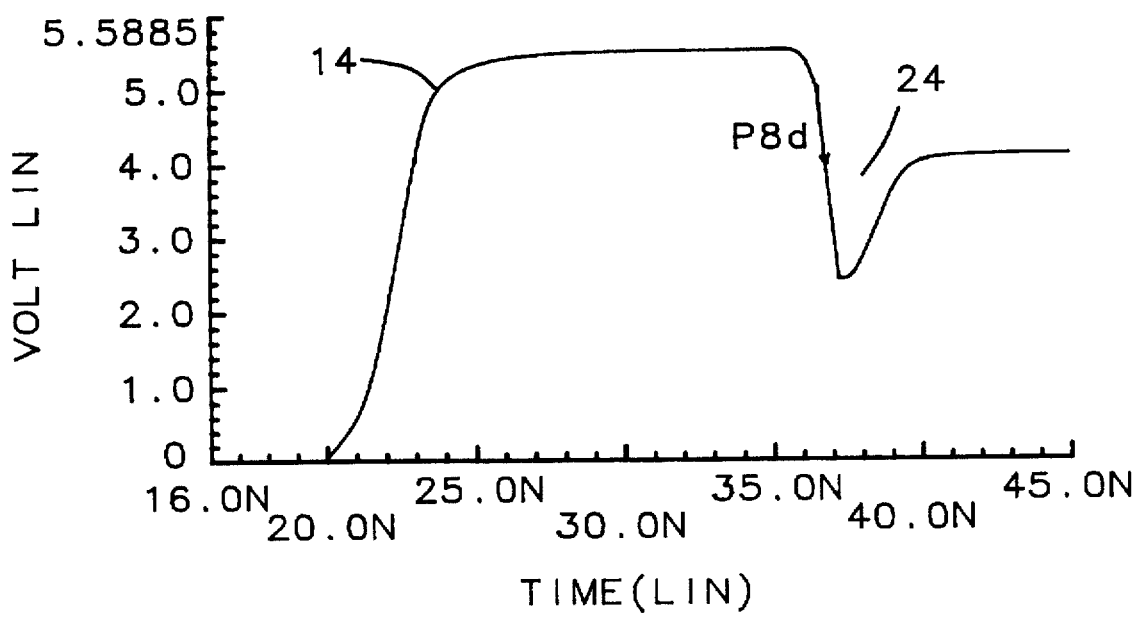
FIG. 2c - Prior Art
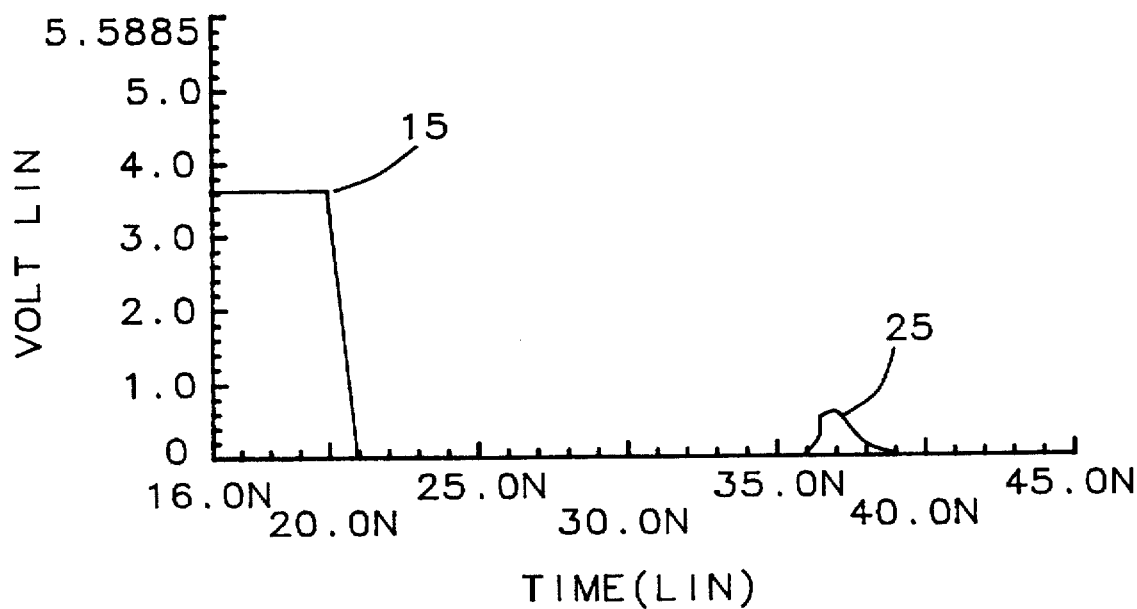
FIG. 2d - Prior Art

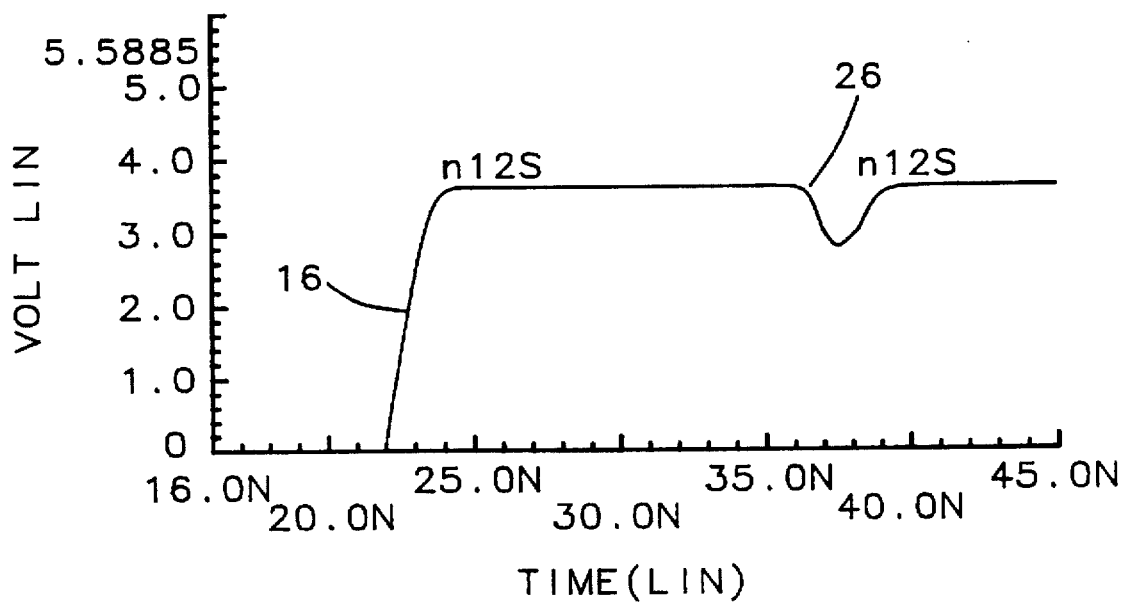
FIG. 2e – Prior Art
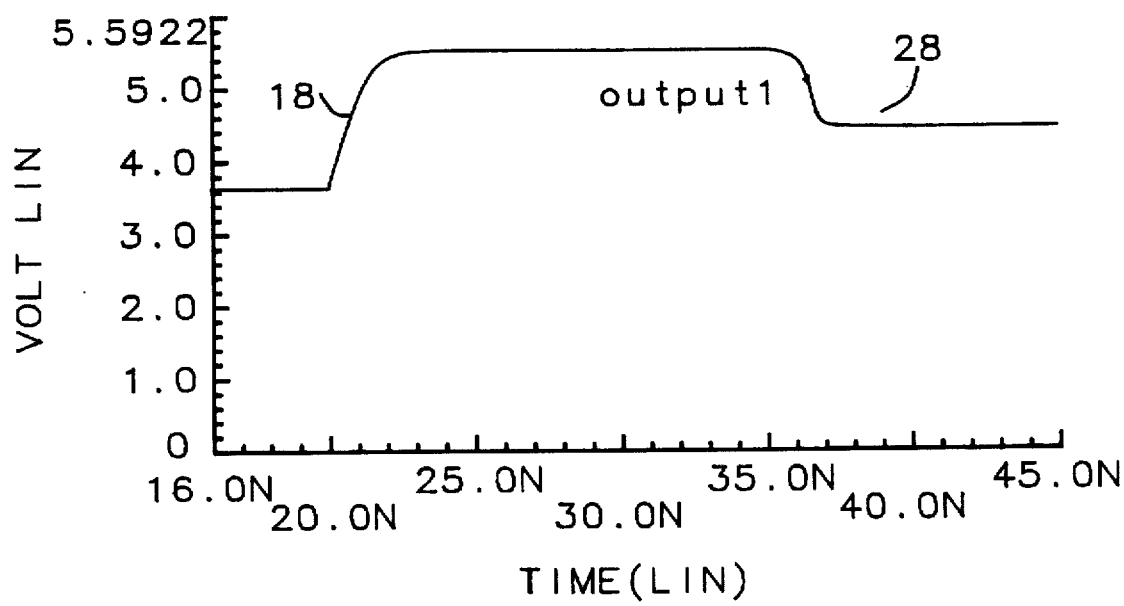
FIG. 2f – Prior Art

LEVEL BOOST RESTORATION CIRCUIT

BACKGROUND OF THE INVENTION

1. Field of the Invention

This invention relates to digital data driving circuits and in particular to those data driving circuits that require output voltage levels that are higher than the circuit power supply voltage and to the elimination of the effects of spurious noise glitches upon said driving circuits.

2. Description of Related Art

In applications such as interfacing arrays of memory cells, it is necessary to provide voltage levels from data driving circuits that are significantly higher than the voltage level of the power supply voltage source. To accomplish this a boost circuit is implemented as shown in FIG. 1. The input terminal In1 is connected to the input of the inverter $I_1$ where the logical state (0 or 1) of the input In1 is inverted at the output N14S of the inverter I1. The output N14S of inverter I1 is connected to the source of N-type metal oxide semiconductor transistor (NMOST) N14 and to the gate of NMOST N13. The source of the NMOST N13 is connected to the ground reference terminal GND and the drain of NMOST N13 is the node P9d which is connected to the gate of P-type metal oxide semiconductor transistor (PMOST) P8, the drain of PMOST P9, and the input of inverter 12. The output N12s of the inverter 12 is connected to the bottom plate B1 of the boost capacitor Cboost.

The gate of NMOST N13 is capacitively coupled to the node P9d. The node P8d is the connection for the drain of NMOST N14, the gate of PMOST P7, and the gate of PMOST P9. The sources of PMOST's P8 and P9, the drain of PMOST P7, and the top plate T1 of boost capacitor Cboost are connected to the output OUT1. The source of PMOST P7 is connected to the power supply voltage source Vcc, while the N-Wells of the PMOST's P7, P8, and P9 are connected to the high internal voltage VH to prevent forward biasing from the drain to the N-well when the output OUT1 is at a boosted high level.

The boost capacitor Cboost is composed of the NMOST's N12 and N13. The gates of the NMOST's N12 and N15 are the top plate T1 of the boost capacitor Cboost. The source and the drains of the NMOST's N12 and N15 connected together to form the bottom plate B1 of the boost capacitor Cboost.

FIGS. 2a-f show the timing diagrams for the various nodal connections in FIG. 1. As the input In1 is brought from a logical 1 to a logical 0 10, the output N14S of the inverter I1 rises from a logical 0 to a logical 1 12.

As the output N14S of the inverter I1 of FIG. 1 rises to approximately the level of the power supply voltage Vcc, the NMOST N14 of FIG. 1 is not conducting, thus preventing any DC current from flowing into the output of the inverter I1. By not allowing any current to flow in through the NMOST N14 of FIG. 1, the node P8d is allowed to rise to a level higher than the voltage level that would normally be the logical 1 14.

At this same time NMOST N13 of FIG. 1 will conduct causing node P9d to fall from a logical 1 to a logical 0 15. Since node P9d is the input to inverter 12 of FIG. 1, the bringing of the node P9d from a logical 1 to a logical 0 will cause node N12s to rise from a logical 0 to a logical 1 16, thus bring the bottom plate B1 of the capacitor Cboost to the voltage of the logical 1.

Having node P8d at a level higher than that of the logical 1 state causes PMOST P7 of FIG. 1 to be forced into non-conduction, while the logical 0 on node P9d will cause PMOST P8 of FIG. 1 to conduct thus connecting the output node OUT1 and node P8d effectively together thus boosting the output voltage OUT1 to a voltage level higher than the voltage of the logical 1 18.

If the input IN1 has a glitch 20, the output N14S of the inverter I1 of FIG. 1 falls to an intermediate level between that of a logical 1 and a logical 0 22. This will cause the node P8d to fall to a level lower than that of the logical 1 state. This will start PMOST's P7 and P9 of FIG. 1 to conduct bringing the output node OUT1 to fall to a level of the logical 1 28.

The voltage at node P9d will begin to rise 25 as the NMOST N13 of FIG. 1 begins to decrease conduction as it starts to turn off. This small change will be inverted in the inverter 12 of FIG. 1, which be the small change at node N12s from a logical 1 26. This small change at node N12s is not sufficient to recharge the boost capacitor Cboost to force the output OUT1 to the level higher than that of the logical 1.

An application for the use of output level boosted circuit is shown in FIG. 3. The input In1 brings the input signal levels that are the logical 1 and the logical 0 to the Level Boost Circuit and the Predriver Circuit. When the input In1 is at a logical 0, the Level Boost Circuit brings point A to a voltage higher than the power supply voltage Vcc, thus forcing NMOST N1 to conduct. At this same condition, the Predriver Circuit brings point B to a logical 0, allowing NMOST N1 to not conduct placing a logical 1 on the Chip Output. This output signal will then be passed to the external circuitry.

If the input has a spurious glitch as in 20 of FIG. 2a, the point A will have the voltage of the node Out1 28 of FIG. 2f. Since the node A can not return to the voltage greater than the power supply Vcc, the NMOST N2 will be partially conducting forcing the Chip Output to level higher than that of a logical 0, thus creating a condition that may corrupt the transfer of data to the External Circuitry.

In U.S. Pat. No. 5,270,588 (Choi) a technique is shown to provide a data output buffer which drives a logic high to a boosted level for a low power supply voltage and to the power supply for high power supply conditions.

U.S. Pat. No. 5,075,571 (Dhong, et al.) demonstrates a PMOS word line driver for a DRAM circuit to provide improved voltage transitions without exterior-generated logic potentials.

SUMMARY OF THE INVENTION

An object of this invention is the exaggeration of a spurious noise glitch that changes from a logical 0 state to a logical 1 state and back to the logical 0 state in a period of time significantly less than that is required for the transfer of digital information. Another object of this invention is the filtering of a spurious noise glitch that changes from the logical 1 state to the logical 0 state and back the logical 1 state in a period of time that is significantly less than that is required for the transfer of information. Still another object of this invention is the restoration of a boosted output level of a driving circuit that can provide an output voltage that is higher than the voltage required for the second logic state.

To accomplish these and other objects, a glitch exaggeration circuit has a one sided delay chain that will delay the time required for the spurious noise glitch to transition from the logical 0 state to the logical 1 state and return to the logical 0 state, thus making the width of spurious noise glitch significantly larger. The glitch exaggeration circuit also has a logical circuit which accepts the original spurious noise glitch and the elongated spurious noise glitch, and combines them such that the elongated spurious noise glitch is passed for a spurious noise glitch that transitions from the logical 0 state to the logical 1 state and returns to the logical 0 state, while filtering the original spurious noise glitch for a spurious noise glitch that transitions from the logical 1 state to the first logical and returns to the logical 1 state. The output of the logical circuit is coupled to a level boost circuit which will restore the output of the level boost circuit to its proper level upon the receipt of a spurious noise glitch.

BRIEF DESCRIPTION OF THE DRAWINGS

FIG. 1 is a schematic diagram of a level boost circuit of prior art.

FIGS. 2a–f are the timing diagrams of the level boost circuit of prior art.

DETAILED DESCRIPTION OF THE INVENTION

Figure 4:
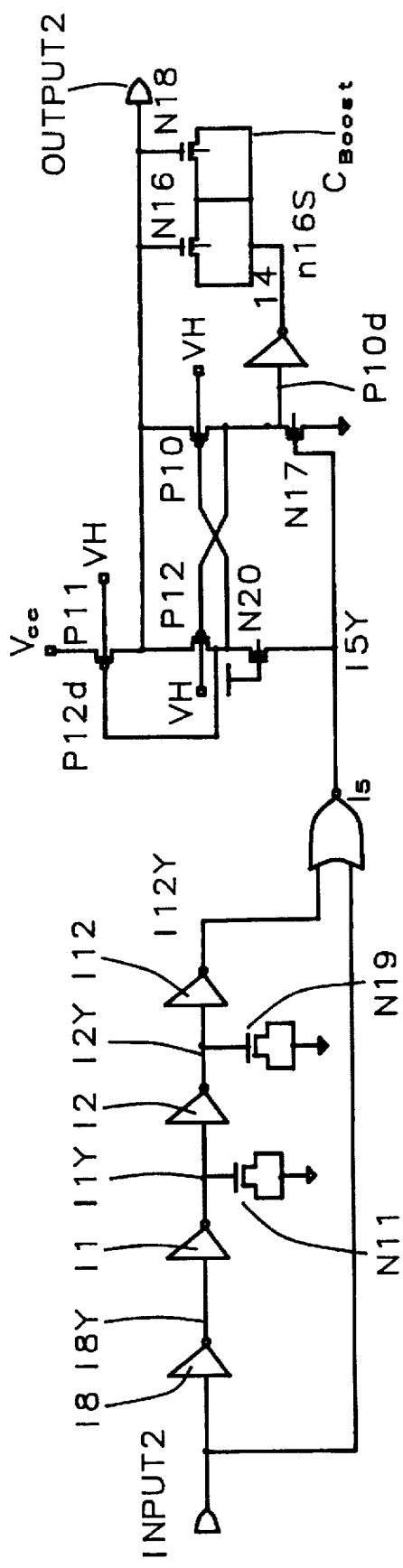
FIG. 4 is a schematic diagram of a pulse elongation circuit coupled to a level boost circuit as in this invention.

The level boost circuit BLC of FIG. 1 is replicated in FIG. 4. The inverter I1 of FIG. 1 is replaced with pulse elongation circuit PEC in FIG. 4.

The pulse elongation circuit PEC has a one side delay chain. The one sided delay chain is composed of the inverters I8, I1, I2, and I12, and NMOST capacitors N11 and N19. The input input2 is connected to the input of inverter I8. The output of inverter I8 is connected to the input of inverter I1. The output of inverter I1 is connected to the input of the inverter I2 and the gate of the NMOST capacitor N11. The source and drain of NMOST capacitor N11 are connected together and to the ground reference point GND. The output of the inverter I2 is connected to the gate of NMOST capacitor N19 and to the input of the inverter I12. The source and drain of the NMOST capacitor N19 are connected together and to the ground reference point GND. The output of the inverter I12 is connected to the first input of NOR circuit I5. The second input of the NOR circuit I5 is connected to the input input2. The output of the NOR circuit I5 is connected to node I5Y of the level boost circuit LBC.

When a spurious noise glitch pulse, that transitions from a logic 0 to a logic 1 and back to the logic 0 in a time that is much shorter than the time of the transition of the data, is presented to the input Input2, the spurious noise glitch pulse is passed to the pulse elongation circuit PEC. Each inverter I8, I1, I2, and I12 has an inherent time delay in the circuit. As the spurious noise glitch pulse pass through each inverter I8, I1, I2, and I12, the delay of each inverter I8, I1, I2, and I12 shifts the spurious noise glitch pulse by the delay of each inverter I8, I1, I2, and I12 relative to the original spurious noise glitch pulse. The circuit of the inverters I8, I1, I2, and I12 is designed such that the delay of a transition from a logical 1 to a logical 0 is longer that the delay from a logical 0 to a logical 1. The presence of the NMOST capacitors N11 and N19 exaggerate this delay even further. By this imbalance in the delay, the spurious noise glitch pulse becomes sufficiently wide that the NOR circuit I5 will respond to the glitch as though it were a data pulse. Additionally when the input Input2 has the spurious noise glitch pulse, that transitions from a logic 0 to a logic 1 and back to the logic 0 in a time that is much shorter than the time of the transition of the data, the elongated pulse must have passed delay chain formed by the inverters I8, I1, I2, and I12 at the same time it has passed through the NOR circuit I5. This will be accomplished through the design of the physical sizes of the inverters I8, I1, I2, and I12 and the NOR circuit I5.

Figure 5A:
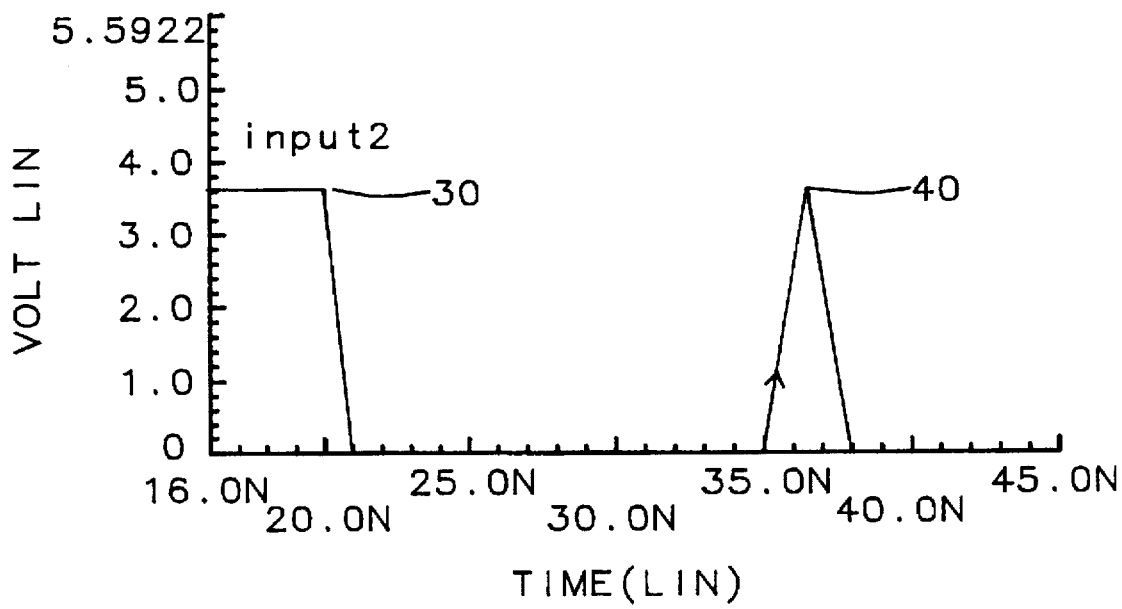
FIGS. 5a–f are timing diagrams of the pulse elongation circuit coupled to level boost circuit of this invention for input with an upward spurious pulse.
Figure 5B:
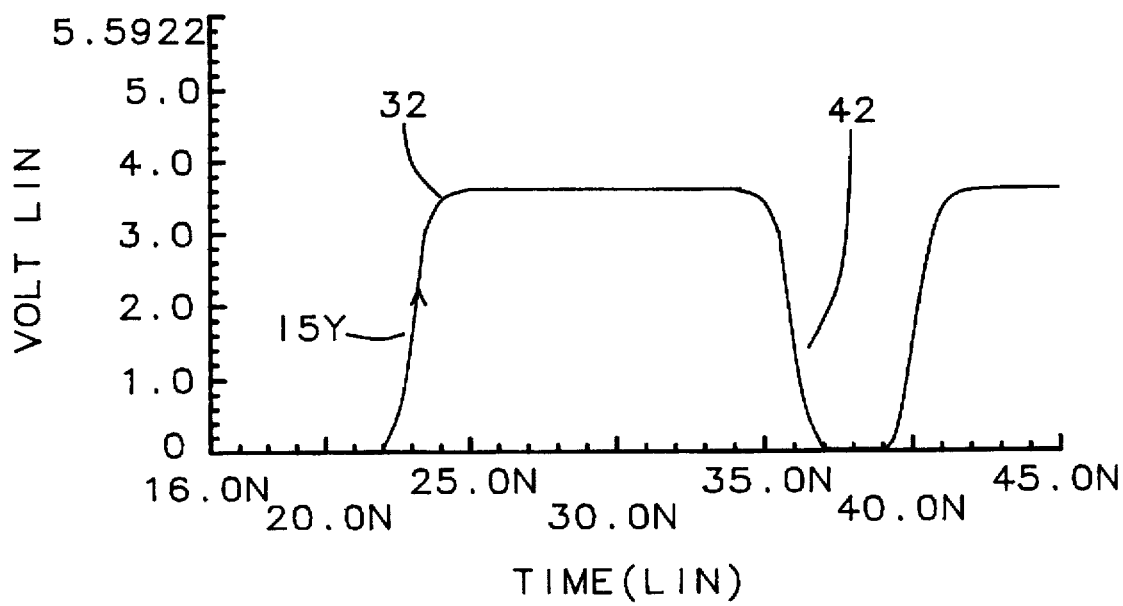
Figure 5C:
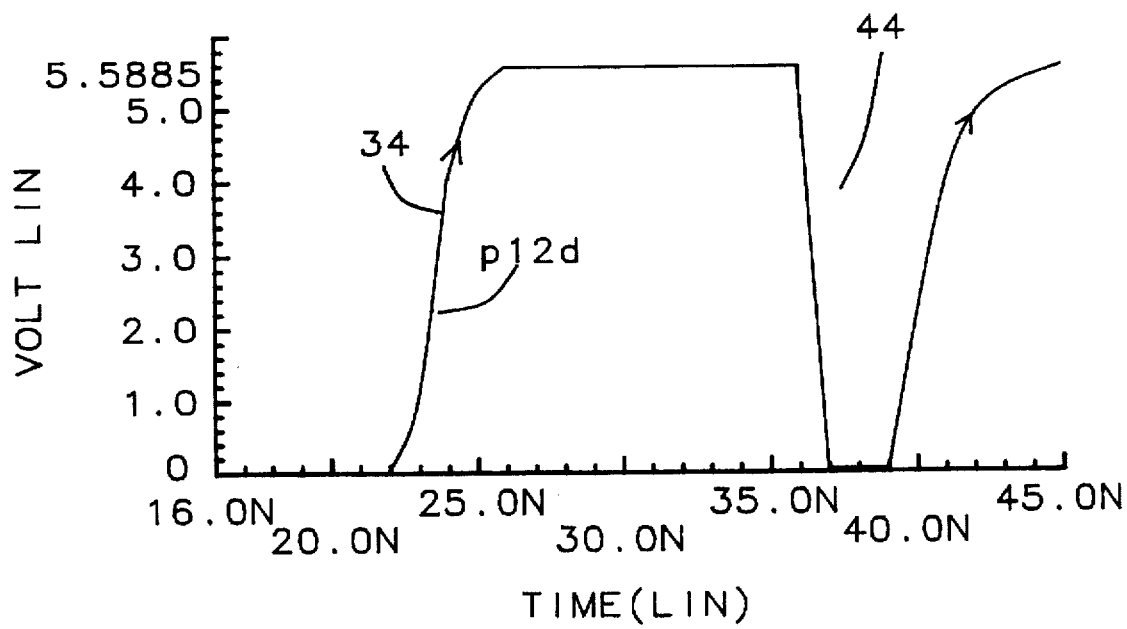
Figure 5D:
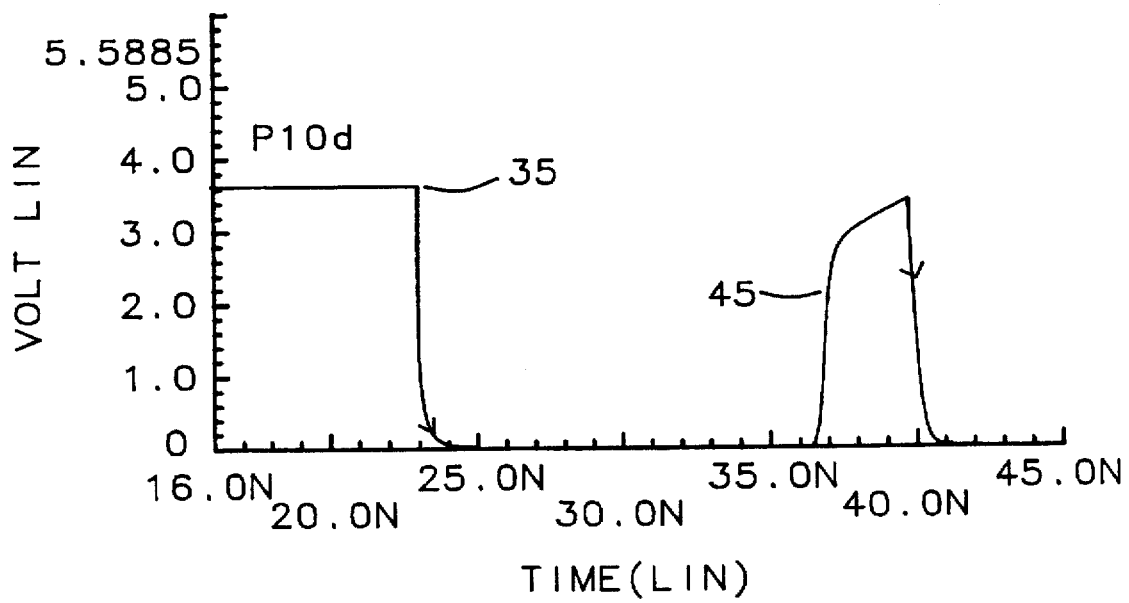
Figure 5E:
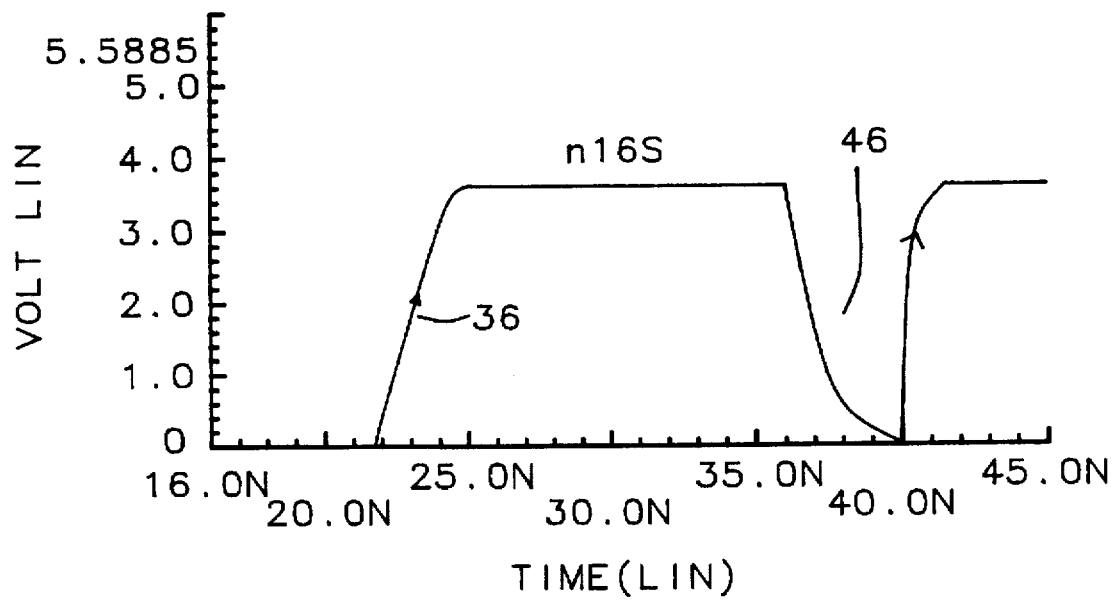
Figure 5F:
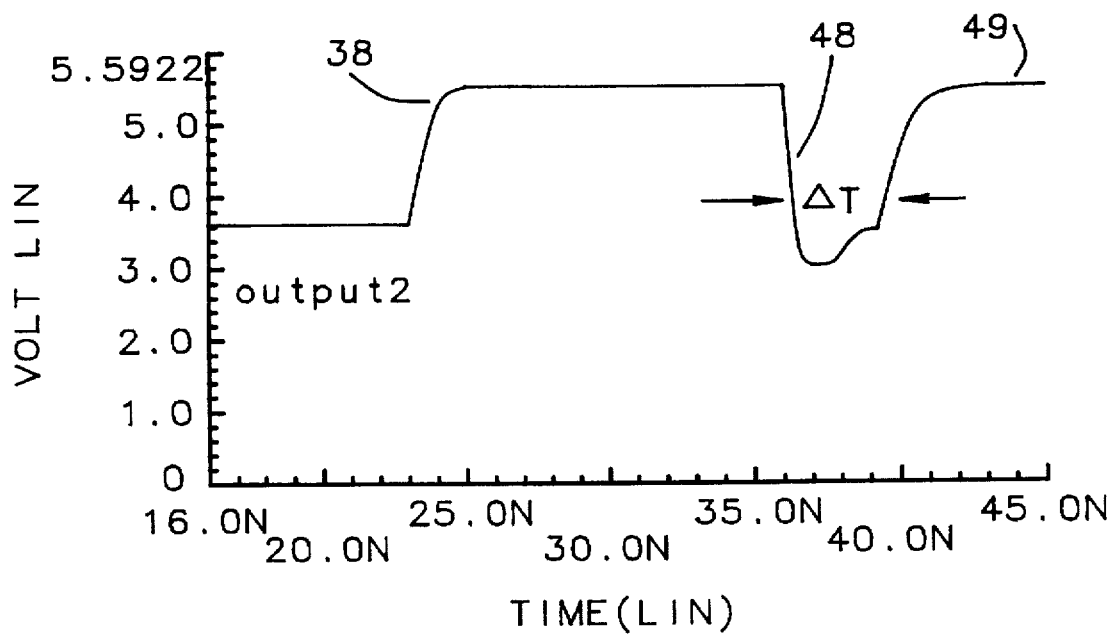
Figure 6A:
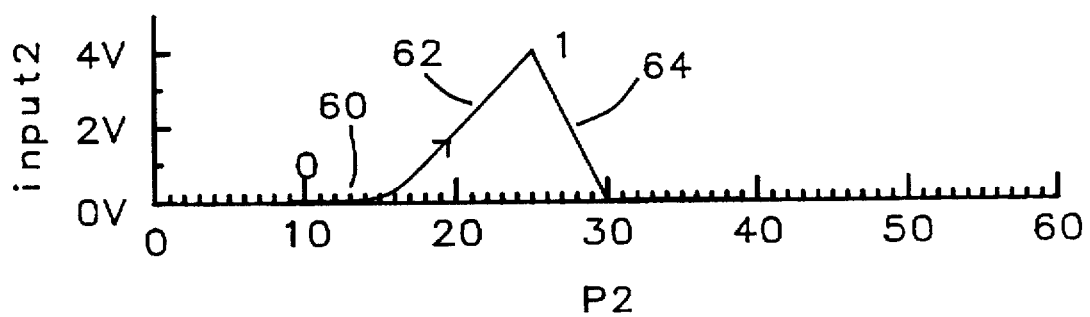
FIGS. 6a–f are timing diagrams of the delay chain of the pulse elongation circuit of this invention for an input with an upward spurious pulse.
Figure 6B:
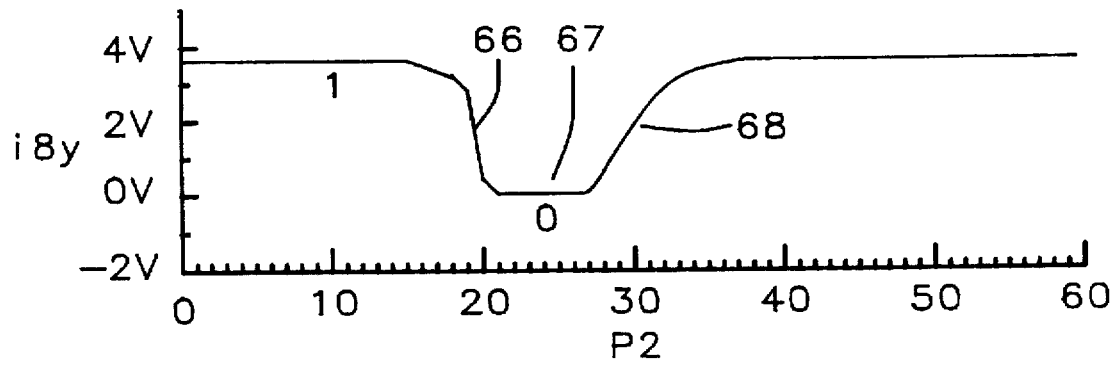
Figure 6C:
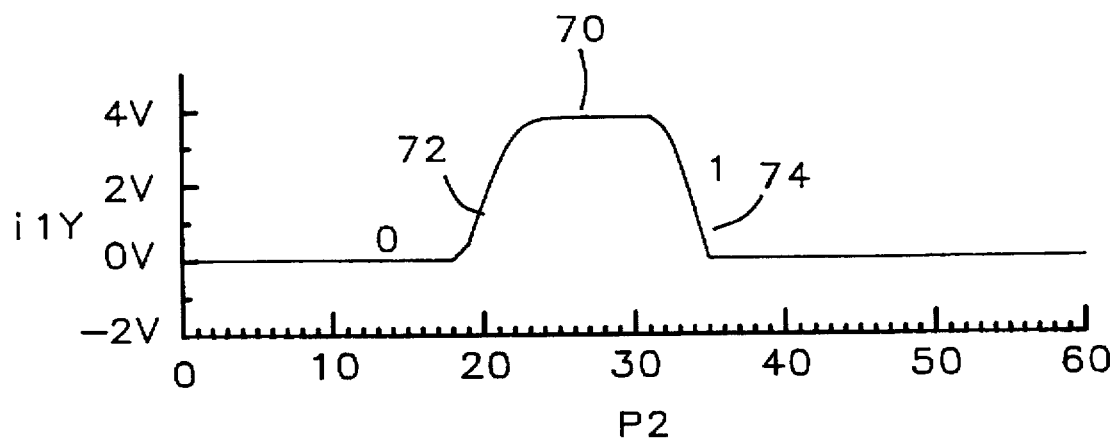
Figure 6D:
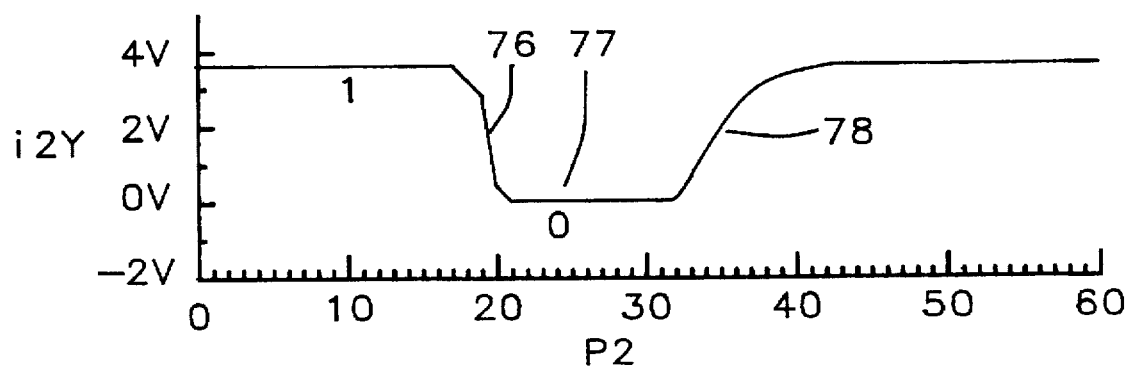
Figure 6E:
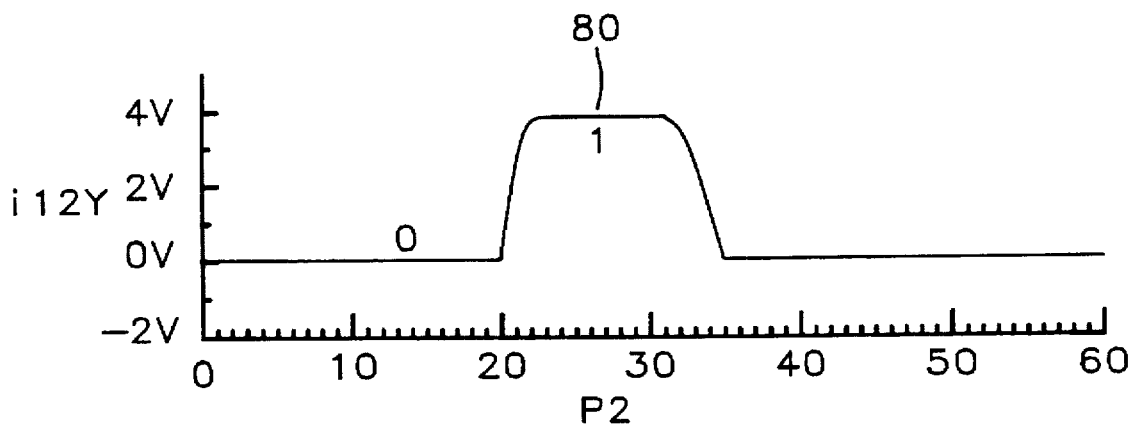
Figure 6F:
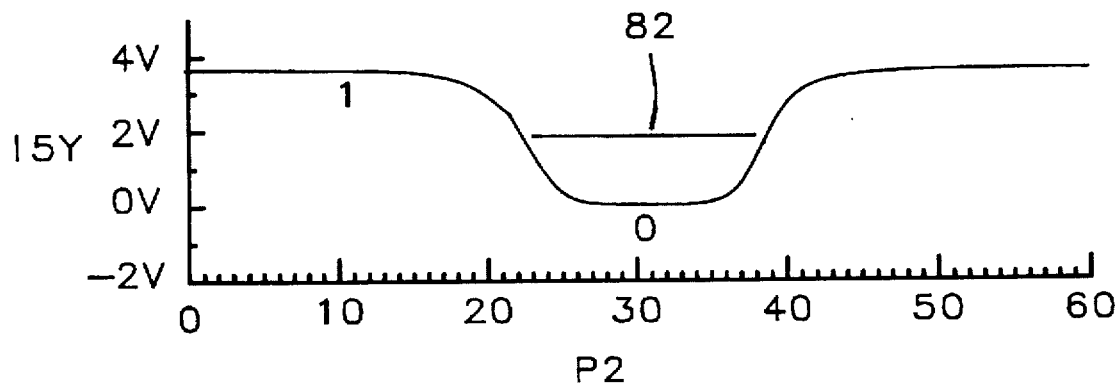

FIGS. 5a–f are timing diagrams showing the results of signals present at the input INPUT2. FIG. 5a shows the input pulse as it transitions from a logical 1 to a logical 0 30. The output I5Y of the NOR circuit 15 of FIG. 4 rises form a logical 0 to a logical 1 32. The responses 34, 35, 36, and 38 of all other nodes P12d, P10D, N16s, and OUTPUT2 are all the same as for nodes P8d, P8d, N12s, and OUT1 in FIGS. 2c–d. As a spurious noise glitch pulse 40 is applied to the input INPUT2 of FIG. 4, the output I5Y of the logical NOR I5 of FIG. 4 will transition completely from a logical 1 to a logical 0 and return to a logical 1 42. The node P12d of FIG. 4, will now transition from the boosted level that is higher than a logical 1 to the level of the logical 0 44 thus making the PMOST P10 of FIG. 4 conduct, node P10D rise to the level of the logical 1, and the node N16s of FIG. 4 go to a logical 0. This will allow the PMOST P11 of FIG. 4 to conduct and bring the output OUTPUT2 to a level 48 that is approximately the level of the power supply voltage source Vcc of FIG. 4 for the output OUTPUT2. Meanwhile, after the delay from the delay chain formed by the inverters I8, I1, I2, and I12 of FIG. 4 has passed the output of the NOR circuit I5Y of FIG. 4 will go to a logical 1 which will make the NMOST N17 of FIG. 4 to conduct causing node P10D to assume a logical 0 45 and node N16s to return to a logical 1 46 thus charging boost capacitor Cboost. As the spurious noise glitch pulse passes the output level will be restored the boosted level 49 since the boost capacitor Cboost can be completely recharged.

FIGS. 6a–f are the timing diagrams of the response of the delay chain formed by the inverters I8, I1, I2, and I12 to the input signal Input2 60. As the input signal Input2 starts to rise to point 62, the output I8Y inverter I8 of FIG. 4 switches 66 to a logical 0 67. The design of the inverter sets its response characteristics such that it remains at the logical 0 67 until the input signal Input2 60 begins the fall toward a logical 0 at point 64. After a delay the output I8Y will start to rise toward a logical 1 68. The output I8Y of inverter I8 of FIG. 4 is connected to the inverter I1 of FIG. 4. The output I1Y 70 will start to rise to a logical 1 72 after a delay due to the capacitor N11 of FIG. 4. The output I1Y will remain a logical 1 until the output I8Y starts to rise 68 and then after the delay due to the capacitor N11 of FIG. 4, the output I8Y will start to fall 74 to a logical 0. The delay contributed by the capacitor N11 of FIG. 4 has further widened the pulse at the output I1Y. The output I1Y 70 is the input to the inverter I2 of FIG. 4. As the output I1Y starts to rise 72 and after a delay due to the capacitor N19 the output I2Y 77 will begin to fall from a logical 1 76 to a logical 0. As the output I1Y begins to fall 74 and after an additional delay due to capacitor N19 the output I2Y 77 will begin to rise 78 to a logical one. The output I2Y of inverter I2 of FIG. 4 is the input to the inverter I12 of FIG. 4. As the output I1Y begins to fall 76 and after a circuit delay of inverter I12 of FIG. 4, the output I12Y 80 rises to a logical 1 and returns to a logical 0 after the output I2Y 76 rises to logical 1. This output is now an elongated spurious noise glitch pulse of sufficient width that when it is applied to the input of NOR I5 of FIG. 4, it will create the output I5Y 82 which when applied to the level boost circuit LBC of FIG. 4 will restore the output Output2 to the level that is greater than the supply voltage source VDD of FIG. 4.

Figure 7:
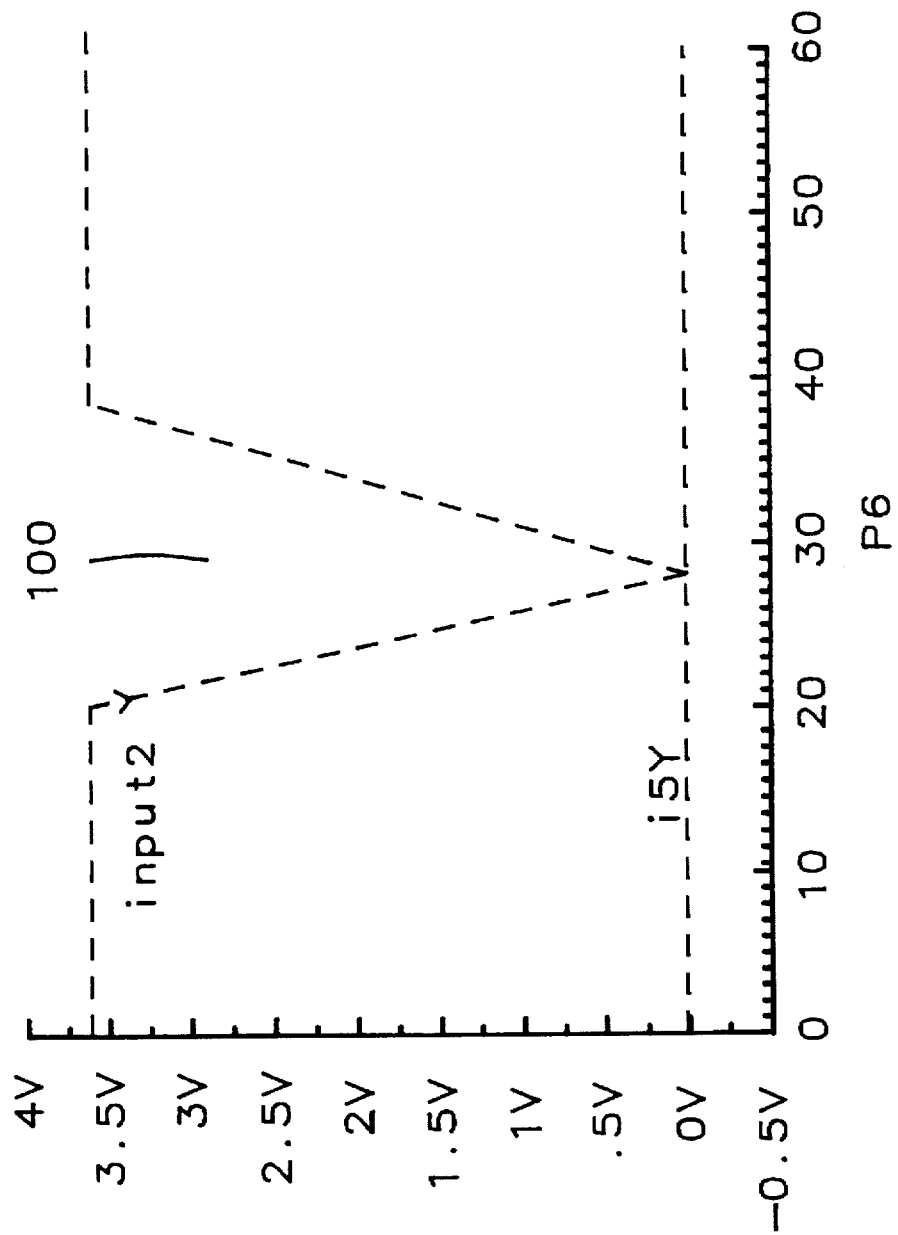
FIG. 7 is a timing diagram of the pulse elongation circuit of this invention for an input with a downward spurious pulse.

FIG. 7 is a timing diagram showing the input signal Input2 having a spurious glitch 100 traversing from a logical 1 to a logical 0 and returning to a logical 1 in a time period that is less than required for the transfer of data. The pulse elongation circuit PEC of FIG. 4 completely filters out this pulse and node I5Y which the output of the NOR gate I5 does not respond to the glitch, thus preventing any response at the output OUTPUT2.

Figure 3:
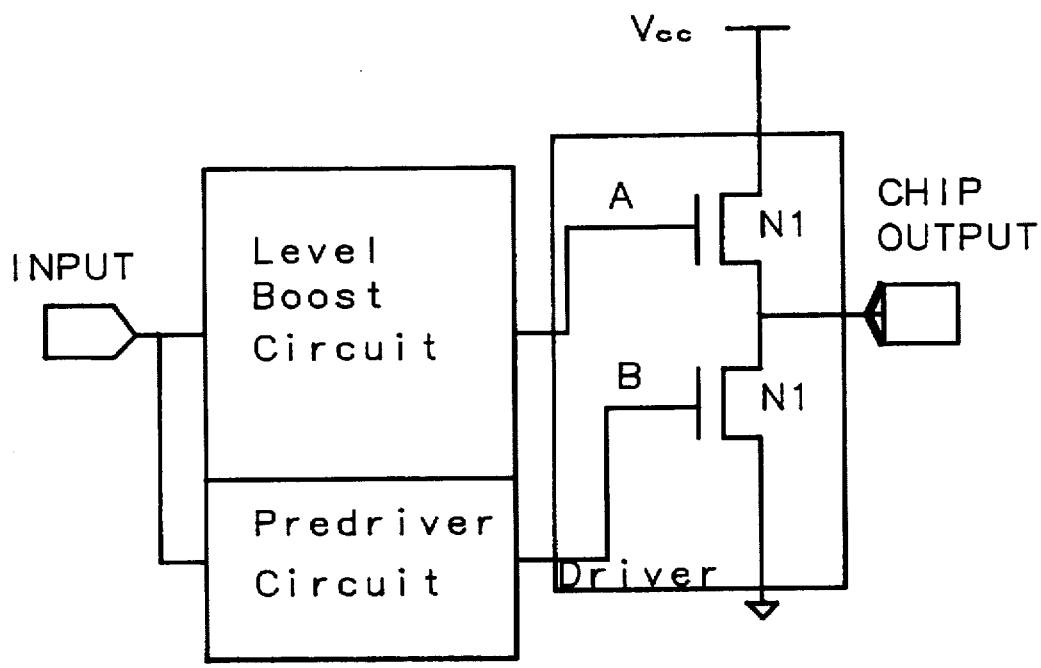
FIG. 3 is schematic diagram of an application for a level boost circuit in an off chip driving circuit.

Referring again to FIG. 3, the level boost circuit of FIG. 4 replaces the level boost circuit of FIG. 1 As the glitch 40 of FIG. 5a passes through the level boost circuit of FIG. 4, the point A receives the signal OUT1. Now instead of point A going to the level of the power supply voltage source Vcc, as in FIG. 2f, the point A will return to the level greater than the power supply voltage source Vcc. The Chip Output will lose its driving capability for only the period that is the width of the glitch Δt of FIG. 5f. This time is not sufficient to cause the output state to switch and corrupt the data being transferred to the external circuitry.

While the invention has been particularly shown and described with reference to the preferred embodiments thereof, it will be understood by those skilled in the art that various changes in form and details may be made without departing from the spirit and scope of the invention.

What is claimed is:

1. A glitch exaggeration circuit to elongate a pulse width time of upward spurious pulse so as to restore an output level of a voltage level boost driver circuit and to not elongate a downward spurious pulse, comprising
    a) an input terminal for the reception of input pulses that repeatedly change from a first logic state to a second logic state and then return to the first logic state over time, including the downward spurious pulses;
    b) a one-sided delay chain circuit with a delay chain input coupled to the input terminal to delay the period of time that the downward spurious pulses required to change from the first logic state to the second logic state and return to the first logic state to form an elongated spurious pulse, and to place said elongated spurious pulse on the delay chain output; and
    c) a logic circuit with a first input coupled to the input terminal to receive the input pulses, a second input terminal coupled to the delay chain output, and output terminal, coupled to the voltage level boost driver circuit, on which a logical combination of the input pulses and the elongated spurious pulse is placed, wherein said logic combination is sufficiently long so as to allow the voltage level boost driver circuit to restore its output level after a passing of the upward spurious pulse and filter any effect from the downward spurious pulse.

2. The circuit of claim 1 wherein the upward spurious pulse is a transition from the first logic state to the second logic state and return to the first logic state in a time period that is short relative to the length of time for a transfer of logical information.

3. The circuit of claim 1 wherein the downward spurious pulse is a transition from the second logic state to the first logic state and return to the second logic state in a time period that is short relative to the length of time for a transfer of logical information.

4. The circuit of claim 1 the one-sided delay chain circuit comprises:
    a) a first inversion circuit coupled to the delay chain input to invert and delay the input pulse;
    b) a plurality of inversion circuits coupled to the first inversion circuit to delay the input pulses by a further amount;
    c) a plurality of capacitors, wherein each capacitor is coupled between a pair of some of the plurality of inversion circuits to further delay the input pulses; and
    d) a last inversion circuit coupled to the plurality of inversion circuits to invert the delayed input pulse and couple the delayed input pulse to the logic circuit.

5. The circuit of claim 1 wherein the elongated spurious pulse will be of sufficient duration so as to allow the restoration of the output level of the voltage level boost driver circuit.

6. A level boost circuit with an output reboost capability to allow the output of said level boost circuit to be restored after the reception of an upward spurious glitch, which will transition from a logical zero state to a logical one state and return to the logical zero state, while not responding to a downward spurious glitch which will transition from the logical one state to the logical zero state and return to the logical one state, comprising:
    a) an input terminal for the reception of input pulses that repeatedly change from the logical zero state to the logical one state and then return to the logical zero state over time, including the downward spurious glitches;
    b) a glitch exaggeration circuit coupled to the input terminal to elongate the Upward spurious glitch to form an elongated glitch pulse and to minimize the downward spurious glitch while not effecting the transfer of other input pulses;
    c) a boosting means coupled to the glitch exaggeration circuit to increase the level of the input pulses, reboost the level from the reception of the upward spurious glitch, and be insensitive to the downward spurious pulse;
    d) a driving means coupled to the boosting means to amplify the boosted input pulses; and
    e) an output terminal coupled to the driving means to transfer the boosted input pulsed to external circuitry.

7. The circuit of claim 6 wherein the upward spurious glitch is a transition from the logical zero state to the logical one state and return to the logical zero state in a time period that is short relative to the length of time for a transfer of logical information.

8. The circuit of claim 6 wherein the downward spurious glitch is a transition from the logical one state to the logical zero state and return to the logical one state in a time period that is short relative to the length of time for a transfer of logical information.

9. The circuit of claim 6 wherein the glitch exaggeration circuit comprises:
    b) a one-sided delay chain circuit with a delay chain input coupled to the input terminal to delay the period of time that the downward spurious glitch required to change from the logical zero state to the logical one state and return to the logical zero state to form an elongated spurious pulse, and to place said elongated spurious pulse on the delay chain output; and c) a logic circuit with a first input coupled to the input terminal to receive the input pulses, a second input terminal coupled to the delay chain output, and output terminal, coupled to the boosting means, on which a logical combination of the input pulses and the elongated spurious pulse is placed, wherein said logic combination is sufficiently long so as to allow the level boosting means to restore its output level after a passing of the upward spurious pulse and reject any effect from the downward spurious glitch.

10. The circuit of claim 9 the one-sided delay chain circuit comprises:

a) a first inversion circuit coupled to the delay chain input to invert and delay the input pulse;

b) a plurality of inversion circuits coupled to the first inversion circuit to delay the input pulses by a further amount;

c) a plurality of capacitors, wherein each capacitor is coupled between a pair of some of the plurality of inversion circuits to further delay the input pulses; and d) a last inversion circuit coupled to the plurality of inversion circuits to invert the delayed input pulse and couple the delayed input pulse to the logic circuit.

11. The circuit of claim 9 wherein the elongated glitch pulse will be of sufficient duration so as to allow the restoration of the output level of the voltage level boost driver circuit.

12. A memory driver circuit with output restore capability coupled between a power supply voltage source and a ground reference point to provide an output voltage that is able to assume a first voltage level that is approximately that of the ground reference point and a second voltage source that is approximately that of the power supply level, and third voltage level that is higher than the second voltage level, comprising:

a) an input terminal for the reception of input pulses that repeatedly change from a first logic state to a second logic state and then return to the first logic state over time, including a upward spurious pulse and a downward spurious pulse;

b) a glitch exaggeration circuit coupled to the input terminal to elongate the upward spurious pulse to form an elongated pulse and to minimize the downward spurious pulse while not effecting the transfer of other input pulses;

c) a boosting means coupled to the glitch exaggeration circuit to increase a restore time of the input pulses, such that it can reboost the level from the reception for the upward spurious pulse, and be insensitive to the downward spurious pulse;

d) a predriving means coupled to the boosting means to amplify the boosted input pulses;

e) an output driving means coupled to the predriving means to amplify the input pulses such that these amplified pulses are at the first voltage level when the input pulses are at the first logic state and the second voltage level when the input pulses are at the second logic state; and f) an output terminal coupled to the output driving means to transfer the amplified input pulses to external memory circuitry.

13. The circuit of claim 12 wherein the upward spurious pulse is a transition from the first logic state to the second logic state and return to the first logic state in a time period that is short relative to the length of time for a transfer of logical information.

14. The circuit of claim 12 wherein the downward spurious pulse is a transition from the second logic state to the first logic state and return to the second logic state in a time period that is short relative to the length of time for a transfer of logical information.

15. The circuit of claim 12 wherein the glitch exaggeration circuit comprises:

b) a one-sided delay chain circuit with a delay chain input coupled to the input terminal to delay the period of time that the spurious glitch required to change from the logical zero state to the logical one state and return to the logical zero state to form an elongated spurious glitch, and to place said elongated spurious glitch on the delay chain output; and c) a logic circuit with a first input coupled to the input terminal to receive the input pulses, a second input terminal coupled to the delay chain output, and output terminal, coupled to the boosting means, on which a logical combination of the input pulses and the elongated spurious glitch is placed, wherein said logic combination is sufficiently long so as to allow the level boosting means to restore its output level after a passing of the upward spurious pulse and reject any effect from the downward spurious pulse.

16. The circuit of claim 15 the one-sided delay chain circuit comprises:

a) a first inversion circuit coupled to the delay chain input to invert and delay the input pulse;

b) a plurality of inversion circuits coupled to the first inversion circuit to delay the input pulses by a further amount;

c) a plurality of capacitors, wherein each capacitor is coupled between a pair of some of the plurality of inversion circuits to further delay the input pulses; and d) a last inversion circuit coupled to the plurality of inversion circuits to invert the delayed input pulse and couple the delayed input pulse to the logic circuit.

17. The circuit of claim 15 wherein the elongated spurious glitch will be of sufficient duration so as to allow the restoration of the output level of the boosting means.

* * * * *